Aug. 25, 1964 P. W. CRIST 3,146,407

TUNABLE REGENERATIVE FEEDBACK AMPLIFIER HAVING CONSTANT ATTENUATION VARIABLE PHASE SHIFT NETWORK

Filed Dec. 1, 1960

INVENTOR.
PHILIP W. CRIST
BY
[signature]
ATTORNEY

United States Patent Office 3,146,407
Patented Aug. 25, 1964

3,146,407

TUNABLE REGENERATIVE FEEDBACK AMPLIFIER HAVING CONSTANT ATTENUATION VARIABLE PHASE SHIFT NETWORK

Philip W. Crist, Huntington Station, N.Y., assignor to Sperry Rand Corporation, Great Neck, N.Y., a corporation of Delaware Filed Dec. 1, 1960, Ser. No. 73,063
7 Claims. (Cl. 331—136)

The present invention generally relates to phase shift oscillators and, more particularly, to a phase shift oscillator employing a reactance-resistance variable phase shift network and a non-phase inverting amplifier for producing constant amplitude oscillations over a broad range of frequencies.

As is well understood in the art, a phase shift oscillator will produce self-sustaining oscillations upon the satisfaction of the two conditions that:

(1) The net phase shift around the oscillating loop is zero or an integral multiple of $2\pi$; and (2) The net gain around the closed feedback loop is unity. One common circuit which can be arranged to satisfy said conditions employs a non-phase inverting amplifier and a resistance-capacity phase shift network for feeding back a portion of the amplifier output signal to the input terminal of the amplifier. The circuit oscillates at the frequency at which the feedback signal experiences a zero phase shift on passing through the resistance-capacity network. The frequency of oscillation may be varied by adjusting the parameters of the network.

One of the problems confronting the designer of the aforementioned oscillator circuit is the difficulty of adjusting the network parameters for frequency tuning purposes without changing the signal attenuation presented by the network at the frequency of oscillation. If the amplifier utilized in the oscillator circuit is designed to operate at essentially constant gain, as the attenuation of the network varies during tuning, so varies the amplitude of the generated oscillations. It is desirable, of course, that constant amplitude oscillations be produced over the frequency range of operation. This is achieved in the prior art by more or less elaborate provisions for the ganged tuning of the network parameters or by providing for some form of amplifier automatic gain control.

It is the principal object of the present invention to provide a simplified reactance-resistance variable frequency oscillator.

Another object is to provide a variable frequency reactance-resistance oscillator for producing constant amplitude oscillations over a wide frequency range.

An additional object is to provide a variable reactance-resistance oscillator for generating constant amplitude oscillations over a wide frequency range in accordance with the setting of a single adjustable parameter.

Another object is to provide a tunable phase shift oscillator utilizing a fixed gain amplifier for producing constant amplitude oscillations at variable frequencies determined in accordance with the setting of a single parameter of the phase shift network.

A further object is to provide a simplified variable reactance-resistance network suitable for use in a tunable oscillator wherein the signal attenuation through the network is constant at the frequency of zero phase shift.

These and other objects, as will appear from a reading of the following specification, are accomplished in a typical embodiment by the provision of an oscillator circuit comprising a non-phase inverting amplifier and a resistance-capacitance phase shift network for interconnecting the output and the input of said amplifier. The phase shift network consists of a tandem connected pair of L networks, the first being high-pass and the second being low-pass in configuration. The output terminal of the amplifier is coupled to the series-connected capacitor of the high-pass section. The input terminal of the amplifier is coupled to an adjustable tap on the series-connected resistor of the low-pass section. The total phase shift through the tandem connected L networks is zero at frequencies which are determined by the positions of the adjustable tap. The gain through the network at those frequencies is always ⅓. By fixing the gain of the non-phase inverting amplifier to 3 or more, the circuit oscillates at a frequency which may be varied by the variation of a single parameter, i.e., by the variation of the position of the tap. The amplitude of the oscillation is substantially independent of frequency over a wide range.

For a more complete understanding of the present invention, reference should be had to the following specification and to the appended figures of which:

Figure 1:
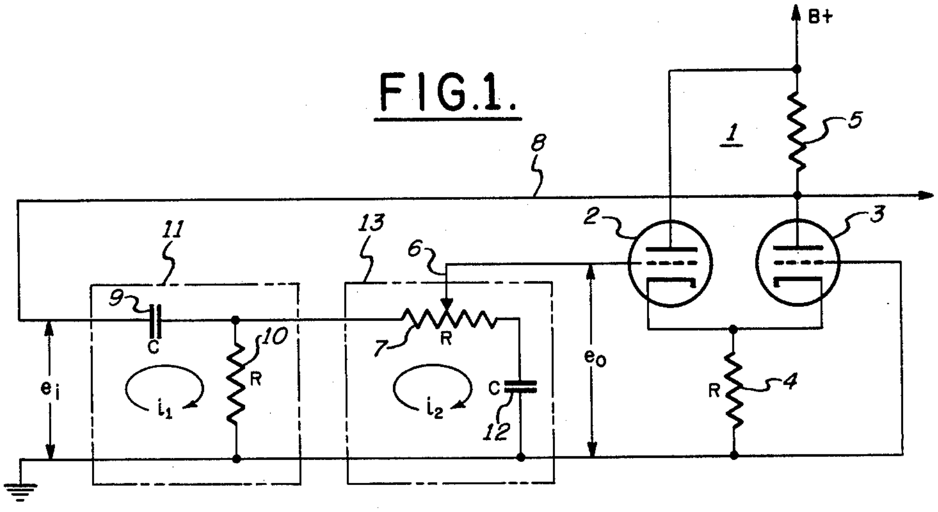
FIG. 1 is a simplified schematic representation of a typical embodiment.

Referring to FIG. 1, non-phase inverting amplifier 1 comprises a cathode follower section 2 which drives grounded grid amplifier section 3. The cathodes of amplifier 1 are connected to ground via resistor 4; the plates thereof are connected to a positive potential source, the plate of section 2 being directly connected to said source and the plate of section 3 being connected through resistor 5 to said source. The input signal to amplifier 1 is derived from the adjustable tap 6 of resistor 7. The output signal produced by amplifier 1 appears on lead 8 at the plate electrode of section 3, which electrode is also directly connected to capacitor 9.

Series capacitor 9 and shunt resistor 10 comprise a first L network 11 of conventional high-pass configuration. Series resistor 7 and shunt capacitor 12 comprise a second L network 13 of low pass configuration. The output terminal of network 11 at the junction of capacitor 9 and resistor 10 is connected to the input terminal of network 13. The lower terminals of resistor 10 and capacitor 12 are connected to ground.

It will now be shown that substantially constant amplitude output oscillations are produced on lead 8 at a frequency within a relatively wide range of frequencies which is determined in accordance with the setting of tap 6 of resistor 7. Such operation is susceptible to the following analysis. Let $i_1$ represent the loop current flowing in network 11 and $i_2$ represent the loop current flowing in network 13. For clarity of exposition, it is initially assumed that resistors 10 and 7 are of the same value and that capacitors 9 and 12 are of the same value. Applying Kirchhoff's laws to network 11:

$$e_i = i_1\left(R + \frac{1}{j\omega C}\right) - i_2 R \tag{1}$$

Similarly, in network 13:

$$0 = -i_1 R + \left(2R + \frac{1}{j\omega C}\right) i_2 \tag{2}$$

Let $\omega RC = \phi$. Equation 1 then becomes:

$$e_i = i_1 R\left(1 + \frac{1}{j\phi}\right) - i_2 R \tag{3}$$

Equation 2 then becomes:

$$0 = -i_1 R + \left(2 + \frac{1}{j\phi}\right) i_2 R \tag{4}$$

Substituting $$i_1R=\left(2+\frac{1}{j\phi}\right)i_2R$$

(from Equation 4) into Equation 1, there results:

$$e_i=\left[\left(2+\frac{1}{j\phi}\right)\left(1+\frac{1}{j\phi}\right)-1\right]i_2R \tag{5}$$

(6)

$e_0$ (the potential from tap 6 of resistor 7 to ground) $=i_2R\left(\alpha+\frac{1}{j\phi}\right)$ where $\alpha$ represents the setting of tap 6 in terms of the ratio of the resistance to the right of tap 6 to the total resistance of resistor 7. Dividing Equation 5 by Equation 6 and simplifying to evaluate the transfer function $$T=\frac{e_i}{e_0}$$

of tandem connected networks 11 and 13, there results:

$$T=\frac{\alpha\left(1-\frac{1}{\phi^2}\right)+\frac{3}{\phi^2}+\frac{1}{j\phi}\left[3\alpha-1+\frac{1}{\phi^2}\right]}{\alpha^2+\frac{1}{\phi^2}} \tag{7}$$

By inspection of Equation 7 it can be seen that for the condition of a zero phase shift through tandem connected networks 11 and 13, the imaginary term must reduce to zero. Thus, $$\frac{1}{\phi^2}=1-3\alpha \tag{8}$$

Substituting Equation 8 into Equation 7

$$T=3 \tag{9}$$

Equation 9 indicates that the transfer function $$\left(\frac{e_i}{e_0}\right)$$

of tandem-connected networks 11 and 13 is always equal to 3 for zero phase shift frequencies independent of the value of $\alpha$, i.e., independent of the setting of tap 6 of resistor 7.

Recalling that $\omega RC=\phi$, Equation 8 may be restated as:

$$\omega^2=\frac{1}{R^2C^2(1-3\alpha)} \tag{10}$$

Figure 2:
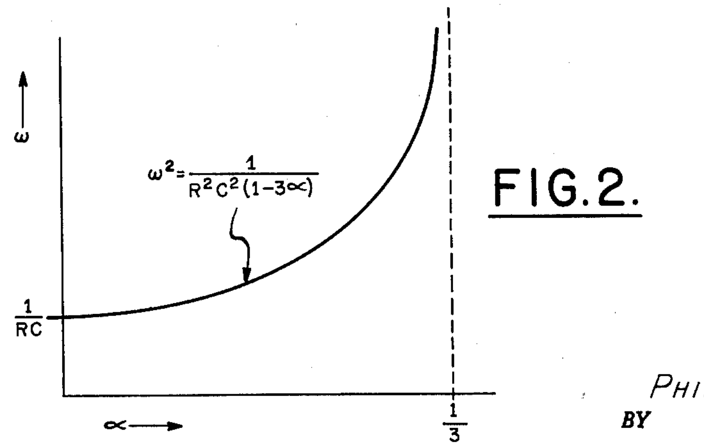
FIG. 2 is a curve illustrating an operational characteristic of the circuit of FIG. 1.

Equation 10 is represented in graphical form in the curve of FIG. 2 which shows that if non-phase inverting amplifier 1 of FIG. 1 is arranged to produce a gain of at least 3, the total circuit will oscillate at a frequency between a lower limit $$\omega=\frac{1}{RC}$$

and an ideal upper limit $\omega=\infty$ as $\alpha$ varies between the values of zero and ⅓.

Equal valued inductances may be substituted for the equal valued capacitors 9 and 12 with a directly analogous result wherein the circuit of FIG. 1 oscillates at a frequency between an upper limit $$\omega=\frac{R}{L}$$

and a lower limit of zero as $\alpha$ varies between the values of zero and ⅓ in accordance with the expression.

$$\omega^2=\frac{R^2(1-3\alpha)}{L^2}$$

Figure 3:
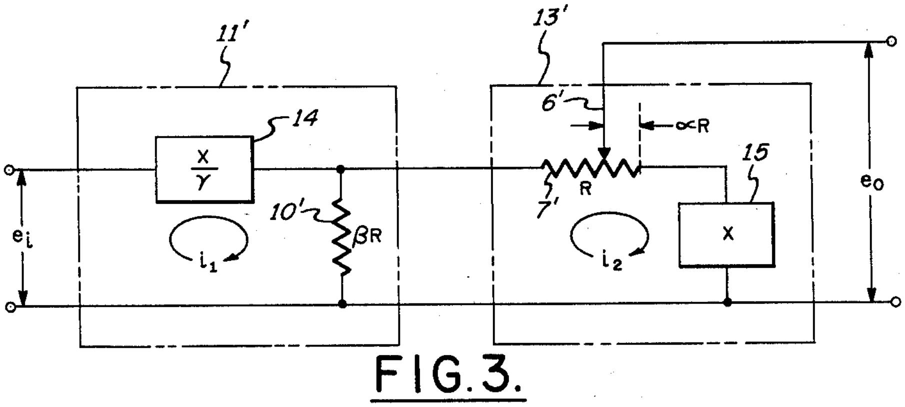
FIG. 3 is a simplified schematic diagram of a more generalized phase shift network suitable for use in the circuit of FIG. 1.

Nonequal valued reactances and nonequal valued resistances may be employed as shown in the generalized schematic drawing of FIG. 3. In FIG. 3, the reactive series element of L network 11' is represented by the block 14 and the reactive shunt element of L network 13' is represented by the block 15. Each reactive element may consist of a capacitive or an inductive reactance or a combination of the two. The value of the reactances presented by blocks 14 and 15 are represented by the factors $x/\gamma$ and $x$, respectively. The values of resistors 10' and 7' are represented by the factors $\beta$R and R, respectively. The factors $\gamma$ and $\beta$ may assume different values not necessarily including unity. It can be shown by an analysis comparable to that followed in connection with FIG. 1 that an oscillatory circuit consisting of networks 11' and 13' connected as shown in FIG. 1 to a non-phase inverting amplifier will produce constant amplitude oscillations at a frequency determined by the setting of tap 6' in accordance with the expression.

$$\frac{x^2}{R^2}=\gamma\beta(1-T'\alpha)$$

The network transfer function T' is equal to $$\frac{1+\beta+\beta\gamma}{\beta\gamma}$$

It should be noted that the transfer function T' of the generalized tandem connected L networks 11' and 13' is independent of $\alpha$, i.e., independent of the setting of tap 6'. Assuming, for example, that nonequal capacitive reactances were employed as elements 14 and 15 of FIG. 3, the total oscillatory circuit including a non-phase inverting amplifier would oscillate at a frequency determined by the setting of tap 6' in accordance with the expression $$\omega^2=\frac{1}{R^2C^2\gamma\beta(1-T'\alpha)}$$

It can be seen from the preceding specification that the objects of the present invention have been accomplished by the provision of a reactance-resistance oscillator circuit comprising a pair of L networks connected in tandem between the output and input terminals of a non-phase inverting amplifier. The amplifier output terminal is connected to the reactance series element of the first network while the amplifier input terminal is connected to a tap on the resistive series element of the second network. The transfer function of the tandem connected networks has a constant value at signal frequencies which experience a zero phase shift on passing through the network. The value of the transfer function at such frequencies is determined solely in accordance with the ratio between the resistive elements and the ratio between the reactive elements of the network pair. By arranging the amplifier to produce a gain which is at least equal to the fixed transfer function value, the over-all circuit will generate oscillations of substantially constant amplitude over a wide range of frequencies determined in accordance with the setting of the tap on the series resistive element of the second L network.

For maximum frequency selectivity or sharpness in tuning the oscillator as a function of the setting of the resistor tap, it has been found that the product $\beta(1+\gamma)$ should be made very much smaller than one. That is, the shunt reactance and the shunt resistance of the L network pair should be small relative to the series reactance and the series resistance, respectively.

It should also be noted that the present invention is readily adapted for operation as a tunable bandpass filter producing a maximum response at a variable frequency within a broad band of frequencies selected in accordance with the setting of the tap on the resistive element. For example, the circuit of FIG. 1 can be modified for such operation merely by adjusting the gain of amplifier 1 to a value less than 3 (whereby self-oscillation is precluded) and applying the signal to be filtered. The input signal may be applied to the grid of either amplifier sections 2 or 3. Of course, the grid grounding connection shown in FIG. 1 is removed in the latter case. The filtered output signal may be derived from the plate of amplifier section 3 or from the common cathodes. Regenerative feedback occurs only at the frequency selected by the position of tap 6 at which there is no phase shift introduced by the tandem connected networks 11 and 13. There is substantially no output at other frequencies.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A circuit comprising a non-phase inverting amplifier and a pair of L networks connected in tandem between the output and input terminals of said amplifier, the first of said pair of networks comprising a reactive series element and a resistive shunt element, and the second of said pair of networks comprising a resistive series element and a reactive shunt element, said series elements being connected in series relationship with said output and input terminals, said shunt elements being connected in shunt relationship with said output and input terminals, the input terminal of said amplifier being connected to a positionable tap on said resistive series element of said second network, the total resistance of said resistive series element remaining fixed irrespective of the position of said tap, and the output terminal of said amplifier being connected to the reactive series element of said first network.

2. A reactance-resistance oscillator circuit for producing substantially constant amplitude oscillations over a wide range of frequencies selected in accordance with the settings of a single circuit parameter, said circuit comprising a non-phase inverting amplifier, and a pair of L networks connected in tandem between the output and input terminals of said amplifier, the first of said pair of networks comprising a reactive series element and a resistive shunt element, and the second of said pair of networks comprising a resistive series element and a reactive shunt element, said series elements being connected in series relationship with said output and input terminals, said shunt elements being connected in shunt relationship with said output and input terminals, the input terminal of said amplifier being connected to a positionable tap on said resistive series element of said second network, the total resistance of said resistive series element remaining fixed irrespective of the position of said tap, and the output terminal of said amplifier being connected to the reactive series element of said first network, the frequency of said oscillations being variable by varying the position of said tap on said resistive series element of said second network.

3. An oscillator circuit as defined in claim 2 wherein each said reactive element comprises a capacitor.

4. An oscillator circuit as defined in claim 3 wherein each said capacitor is of the same capacitance and each said resistive element is of the same resistance.

5. A variable reactance-resistance network wherein the signal attenuation through said network is constant at the frequencies of signals which experience a zero phase shift on passing through said network from the input terminal to the output terminal thereof, said network comprising a pair of L networks connected in tandem, the first of said pair of L networks comprising a reactive series element and a resistive shunt element and the second of said pair of L networks comprising a resistive series element and a reactive shunt element, said series elements being connected in series relationship with said input and output terminals, said shunt elements being connected in shunt relationship with said input and output terminals, said input terminal being connected to said reactive series element and said output terminal being connected to a positionable tap on said resistive series element, the total resitance of said resistive series element remaining fixed irrespective of the position of said tap.

6. A variable reactance-resistance network as defined in claim 5 wherein each said reactive element comprises a capacitor.

7. A variable reactance-resistance network as defined in claim 6 wherein each said capacitor is of the same capacitance and each said resistive element is of the same resistance.

References Cited in the file of this patent

UNITED STATES PATENTS

| | | |
|---|---|---|
| 2,396,224 | Artzt | Mar. 12, 1946 |
| 2,444,084 | Artzt | June 29, 1948 |
| 2,748,285 | Beaufoy | May 29, 1956 |

FOREIGN PATENTS

| | | |
|---|---|---|
| 497,148 | Great Britain | Dec. 12, 1938 |
| 685,673 | Germany | Dec. 22, 1939 |